United States Patent
Fang

(10) Patent No.: US 12,133,444 B2
(45) Date of Patent: Oct. 29, 2024

(54) DISPLAY PANEL AND DISPLAY DEVICE WITH UNDERCUT ORGANIC-INORGANIC LAYER IN TRANSITION REGION

(71) Applicant: WUHAN CHINA STAR OPTOELECTRONICS SEMICONDUCTOR DISPLAY TECHNOLOGY CO., LTD., Wuhan (CN)

(72) Inventor: Liang Fang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/433,968

(22) PCT Filed: Jun. 7, 2021

(86) PCT No.: PCT/CN2021/098645
§ 371 (c)(1),
(2) Date: Aug. 25, 2021

(87) PCT Pub. No.: WO2022/241868
PCT Pub. Date: Nov. 24, 2022

(65) Prior Publication Data
US 2024/0016027 A1    Jan. 11, 2024

(30) Foreign Application Priority Data
May 20, 2021 (CN) .......................... 202110548902.9

(51) Int. Cl.
*H10K 59/65* (2023.01)
*H10K 59/121* (2023.01)
*H10K 59/80* (2023.01)

(52) U.S. Cl.
CPC ......... *H10K 59/65* (2023.02); *H10K 59/1213* (2023.02); *H10K 59/873* (2023.02)

(58) Field of Classification Search
CPC ... H10K 59/65; H10K 59/1213; H10K 59/873
See application file for complete search history.

(56) References Cited

U.S. PATENT DOCUMENTS

| 5,701,055 A | 12/1997 | Nagayama |
| 10,347,866 B1 | 7/2019 | Kim |

(Continued)

FOREIGN PATENT DOCUMENTS

| CN | 106229321 A | 12/2016 |
| CN | 107785502 A | 3/2018 |

(Continued)

OTHER PUBLICATIONS

International Search Report in International application No. PCT/CN2021/098645, mailed on Feb. 16, 2022.

(Continued)

*Primary Examiner* — Lex H Malsawma
(74) *Attorney, Agent, or Firm* — PV IP PC; Wei Te Chung

(57) ABSTRACT

The present disclosure discloses a display panel and a display device. The display panel includes a display region, an optical-device region, and a transition region, and further includes a substrate; and a thin-film-transistor layer disposed on one side of the substrate, wherein the thin-film-transistor layer comprises at least one undercut structure within the transition region, wherein the undercut structure comprises at least one inorganic layer and at least one organic layer; wherein one inorganic layer is at least disposed on one side of the organic layer away from the substrate; and wherein an orthographic projection area of the organic layer on the substrate is located within an orthographic projection area, (Continued)

of the inorganic layer away from one side of the substrate and close to the organic layer, on the substrate.

20 Claims, 5 Drawing Sheets

(56) References Cited

U.S. PATENT DOCUMENTS

2020/0251543 A1\* 8/2020 Lee .................... H10K 50/8426
2021/0376288 A1\* 12/2021 Wang .................. H10K 50/844

FOREIGN PATENT DOCUMENTS

| CN | 109920818 A | 6/2019 |
| CN | 110265583 A | 9/2019 |
| CN | 110678997 A | 1/2020 |
| CN | 111063713 A | 4/2020 |
| CN | 111430566 A | 7/2020 |
| CN | 111584730 A | 8/2020 |
| CN | 111653522 A | 9/2020 |
| CN | 111933822 A | 11/2020 |

OTHER PUBLICATIONS

Written Opinion of the International Search Authority in International application No. PCT/CN2021/098645, mailed on Feb. 16, 2022.
Chinese Office Action issued in corresponding Chinese Patent Application No. 202110548902.9 dated Jul. 1, 2022, pp. 1-8.

\* cited by examiner

DISPLAY PANEL AND DISPLAY DEVICE WITH UNDERCUT ORGANIC-INORGANIC LAYER IN TRANSITION REGION

RELATED APPLICATIONS

This application is a Notional Phase of PCT Patent Application No. PCT/CN2021/098645 having international filing date of Jun. 7, 2021, which claims the benefit of priority of Chinese Patent Application No. 202110548902.9 filed on May 20, 2021. The contents of the above applications are all incorporated by reference as if fully set forth herein in their entirety.

FIELD OF INVENTION

The present disclosure relates to the technical field of display, and specifically to a display panel and a display device.

BACKGROUND OF INVENTION

An important performance of an organic light-emitting diode (OLED) is a camera function. Currently, a mainstream technology is to arrange components with the camera function in a peripheral non-display region of a display device. This method has one big drawback is that the display device is less integrated and an effective display region is greatly reduced. An existing method for increasing the effective display region of the display device is to arrange a camera assembly in a display region, and the display device adopts an open hole design (O-Cut) corresponding to an area of the camera assembly.

However, in the prior art, a light-emitting function layer contains a film with a low light transmission effect. In order to improve an imaging effect, the light-emitting function layer in the area of the camera assembly needs to be removed by laser cutting. After laser cutting, one side of the light-emitting function layer is exposed to the external environment and is easily corroded by water and oxygen, which affects stability of the display device.

SUMMARY OF INVENTION

Embodiments of the present disclosure provide a display panel and a display device, which can reduce risk of corrosion of the display panel by external water and oxygen, thereby improving stability of the display device and improving product performance.

An embodiment of the present disclosure provides a display panel that includes a display region, an optical-device region, and a transition region between the display region and the optical-device region,
wherein the display panel includes:
a substrate;
a thin-film-transistor layer disposed on one side of the substrate, wherein the thin-film-transistor layer includes at least one undercut structure within the transition region, wherein the undercut structure includes at least one inorganic layer and at least one organic layer; wherein one inorganic layer is at least disposed on one side of the organic layer away from the substrate; and wherein an orthographic projection area of the organic layer on the substrate is located within an orthographic projection area, of the inorganic layer away from one side of the substrate and close to the organic layer, on the substrate.

Optionally, in some embodiments of the present disclosure, the undercut structure includes at least one sub-undercut structure that includes one inorganic layer and at least one organic layer, wherein in each sub-undercut structure, the organic layer is stacked and disposed on one side of the inorganic layer close to the substrate; and in the sub-undercut structure, a minimum distance is defined between an edge of the orthographic projection area, of one side, of the organic layer away from the inorganic layer, away from the display region, on the substrate, and an edge of the orthographic projection area, of one side of the inorganic layer away from the display region, on the substrate, and wherein the minimum distance is greater than a total thickness of the at least one organic layer.

Optionally, in some embodiments of the present disclosure, the display panel further includes a first array layer within the transition region, the first array layer is disposed between the substrate and the undercut structure, and the first array layer includes at least one inorganic insulation layer; and in the sub-undercut structure close to the first array layer, the organic layer close to the substrate is directly in contact with the inorganic insulation layer in the first array layer.

Optionally, in some embodiments of the present disclosure, the undercut structure includes one sub-undercut structure that includes one organic layer, two organic layers, or three organic layers.

Optionally, in some embodiments of the present disclosure, the thin-film-transistor layer includes an organic interlayer insulation layer, a first source-and-drain layer, a first planarization layer, a second source-and-drain layer, a second planarization layer, and a first electrode layer, and the sub-undercut structure is one of following laminated structures:

a laminated structure composed of the first source-and-drain layer and the organic interlayer insulation layer;
a laminated structure composed of the second source-and-drain layer and the organic interlayer insulation layer;
a laminated structure composed of the second source-and-drain layer and the first planarization layer;
a laminated structure composed of the second source-and-drain layer, the first planarization layer, and the organic interlayer insulation layer;
a laminated structure composed of the first electrode layer and the organic interlayer insulation layer;
a laminated structure composed of the first electrode layer and the first planarization layer;
a laminated structure composed of the first electrode layer and the second planarization layer;
a laminated structure composed of the first electrode layer, the organic interlayer insulation layer, and the first planarization layer;
a laminated structure composed of the first electrode layer, the organic interlayer insulation layer, and the second planarization layer;
a laminated structure composed of the first electrode layer, the first planarization layer, and the second planarization layer; and
a laminated structure composed of the first electrode layer, the organic interlayer insulation layer, the first planarization layer, and the second planarization layer.

Optionally, in some embodiments of the present disclosure, the undercut structure includes one sub-undercut structure and a second inorganic layer, and the second inorganic layer is disposed on one side of the sub-undercut structure close to the substrate, and the orthographic projection area of each organic layer in the sub-undercut structure on the substrate is located within an orthographic projection area of the second inorganic layer on the substrate.

Optionally, in some embodiments of the present disclosure, the thin-film-transistor layer includes an organic interlayer insulation layer, a first source-and-drain layer, a first planarization layer, a second source-and-drain layer, a second planarization layer, and a first electrode layer, and the undercut structure is one of following laminated structures:

- a laminated structure composed of the first source-and-drain layer, the first planarization layer, and the first electrode layer;
- a laminated structure composed of the first source-and-drain layer, the first planarization layer, and the second source-and-drain layer;
- a laminated structure composed of the first source-and-drain layer, the first planarization layer, the second planarization layer, and the first electrode layer; and
- a laminated structure composed of the second source-and-drain layer, the second planarization layer, and the first electrode layer.

Optionally, in some embodiments of the present disclosure, the undercut structure includes a first sub-undercut structure and a second sub-undercut structure that are stacked, and the first sub-undercut structure is disposed on one side of the second undercut structure away from the substrate.

Optionally, in some embodiments of the present disclosure, the orthographic projection area of each organic layer in the first sub-undercut structure on the substrate is located within an orthographic projection area of the inorganic layer in the second sub-undercut structure on the substrate.

Optionally, in some embodiments of the present disclosure, the thin-film-transistor layer includes an organic interlayer insulation layer, a first source-and-drain layer, a first planarization layer, a second source-and-drain layer, a second planarization layer, and a first electrode layer, and the undercut structure is one of following laminated structures:

- a laminated structure composed of the organic interlayer insulation layer, the first source-and-drain layer, the first planarization layer, and the second source-and-drain layer;
- a laminated structure composed of the organic interlayer insulation layer, the first source-and-drain layer, the first planarization layer, and the first electrode layer;
- a laminated structure composed of the organic interlayer insulation layer, the first source-and-drain layer, the first planarization layer, the second planarization layer, and the first electrode layer;
- a laminated structure composed of the organic interlayer insulation layer, the second source-and-drain layer, the second planarization layer, and the first electrode layer;
- a laminated structure composed of the organic interlayer insulation layer, the first planarization layer, the second source-and-drain layer, the second planarization layer, and the first electrode layer; and
- a laminated structure of the first planarization layer, the second source-and-drain layer, the second planarization layer, and the first electrode layer.

Optionally, in some embodiments of the present disclosure, the first array layer extends into the display region, and wherein within the display region, the display panel further includes a second array layer that is disposed on one side of the first array layer away from the substrate, and the undercut structure is spaced apart from the second array layer.

Optionally, in some embodiments of the present disclosure, the first array layer extends into the display region, and wherein within the display region, the display panel further includes a second array layer that is disposed on one side of the first array layer away from the substrate, and there is one undercut structure connected to the second array layer.

Optionally, in some embodiments of the present disclosure, the display panel comprises two or more undercut structures that are disposed within the transition region and spaced apart from each other in a direction away from the display region.

Optionally, in some embodiments of the present disclosure, the second array layer includes an inorganic metal layer and an organic insulation layer, and the organic insulation layer is disposed on one side of the inorganic metal layer close to the substrate, and wherein the organic layer and the organic insulation layer are provided in a manner of the same layer, and the inorganic layer and the inorganic metal layer are provided in a manner of the same layer.

Correspondingly, an embodiment of the present disclosure further provides a display device, including the display panel provided by any one of the embodiments of the present disclosure.

Embodiments of the present disclosure provide a display panel and a display device. The display panel includes a display region, an optical-device region, and a transition region between the display region and the optical-device region, and the display panel includes a substrate; and a thin-film-transistor layer disposed on one side of the substrate, wherein the thin-film-transistor layer comprises at least one undercut structure within the transition region, wherein the undercut structure comprises at least one inorganic layer and at least one organic layer; wherein one inorganic layer is at least disposed on one side of the organic layer away from the substrate; and wherein an orthographic projection area of the organic layer on the substrate is located within an orthographic projection area, of the inorganic layer away from one side of the substrate and close to the organic layer, on the substrate. In the embodiments of the present disclosure, the undercut structure formed by the organic layer and the inorganic layer is arranged within the transition region of the display panel, such that in the subsequent manufacturing process of the display panel, an organic light-emitting layer is disconnected at the undercut structure. An encapsulation layer encapsulates and protects the organic light-emitting layer at a disconnection position, to block a path of external water and oxygen entering the display region through one side of the organic light-emitting layer, thereby reducing the risk of external water and oxygen corroding the display panel, to improve the stability of the display device and improve the product performance.

BRIEF DESCRIPTION OF DRAWINGS

To clearly explain technical solutions in embodiments of the present disclosure, drawings needed to describe the embodiments will be briefly introduced as follows. Obviously, the drawings in the following description are only some embodiments of the present disclosure. For those skilled in the art, other drawings can be obtained based on these drawings without creative work.

DETAILED DESCRIPTION OF PREFERRED EMBODIMENTS

Figure 1:
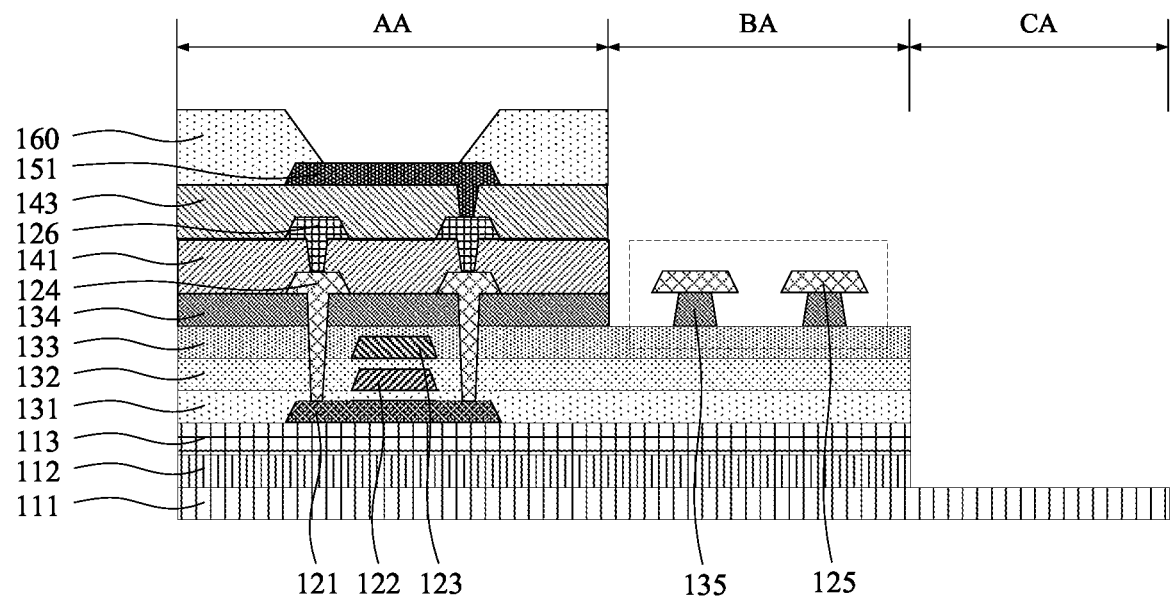
FIG. 1 is a schematic diagram of a first structure of a display panel provided by an embodiment of the present disclosure.

Technical solutions in embodiments of the present disclosure will be clearly and completely described below in conjunction with drawings in the embodiments of the present disclosure. Obviously, the described embodiments are only a part of the embodiments of the present disclosure, rather than all of the embodiments. Based on the embodiments in the present disclosure, all other embodiments obtained by those skilled in the art without creative work shall fall within a protection scope of the present disclosure. In addition, it should be understood that specific implementations described herein are only used to illustrate and explain the present disclosure, and are not used to limit the present disclosure. In the present disclosure, unless otherwise stated, directional words used such as "upper" and "lower" generally refer to the upper and lower directions of a device in actual use or working state, and specifically refer to drawing directions in the drawings; and "inner" and "outer" refer to an outline of the device.

Embodiments of the present disclosure provide a display panel and a display device to reduce risk of corrosion of the display panel by external water and oxygen, thereby improving stability of the display device, and improving product performance. Detailed descriptions are provided below. It should be noted that an order of description in the following embodiments is not meant to limit a preferred order of the embodiments.

In an embodiment, please refer to FIGS. 1 to 7. FIG. 1 to FIG. 7 respectively show seven schematic structural diagrams of the display panel provided by the embodiment of the present disclosure. As shown in the figure, the display panel provided by the embodiment of the present disclosure includes a display region AA, an optical-device region CA, and a transition region BA between the display region AA and the optical-device region CA. The display panel includes a substrate 111 and a thin-film-transistor layer. The thin-film-transistor layer is arranged on one side of the substrate 111. The thin-film-transistor layer includes at least one undercut structure within the transition region BA. The undercut structure includes at least one inorganic layer and at least one organic layer. One inorganic layer is at least disposed on one side of the organic layer away from the substrate 111. An orthographic projection area of the organic layer on the substrate 111 is located within an orthographic projection, of the inorganic layer away from one side of the substrate and close to the organic layer, on the substrate 111.

In the embodiment of the present disclosure, an undercut structure formed by the organic layer and the inorganic layer is arranged within the transition region of the display panel, such that in the subsequent manufacturing process of the display panel, the organic light-emitting layer is disconnected at the undercut structure. An encapsulation layer encapsulates and protects the organic light-emitting layer at a disconnection position, to block a path of external water and oxygen entering the display region through one side of the organic light-emitting layer, thereby reducing the risk of external water and oxygen corroding the display panel, to improve the stability of the display device and improve the product performance.

Specifically, in an embodiment, please refer to FIGS. 1 to 5, in the display region AA, the display panel provided by the embodiment of the present disclosure includes a substrate 111, a light-shielding layer 112, a buffer layer 113, a semiconductor active layer 121, a first gate insulation layer 131, a first gate layer 122, a second gate insulation layer 132, a second gate layer 123, a first interlayer insulation layer 133, a second interlayer insulation layer 134, a first source-and-drain layer 124, a first planarization layer 141, a second source-and-drain layer 126, a second planarization layer 143, a first electrode layer 151, and a pixel definition layer 160, which are sequentially arranged in a direction from bottom to top. In the transition region BA, the display panel provided by the embodiment of the present disclosure includes the substrate 111, the light-shielding layer 112, the buffer layer 113, the first gate insulation layer 131, the second gate insulation layer 132, and the first interlayer insulation layer 133. In the optical-device region CA, the display panel provided by the embodiment of the present disclosure only includes the substrate 111.

The substrate 111 may be a rigid substrate or a flexible substrate. The rigid substrate is generally a glass substrate. The flexible substrate generally includes a first organic substrate, a second inorganic substrate, and an inorganic substrate between the first organic substrate and the second inorganic substrate. The semiconductor active layer 121 is patterned to form an active region of a thin film transistor. The active region includes a channel region and doped regions on both sides of the channel region. In addition, the material of the semiconductor active layer 121 can be oxide semiconductor material, or polycrystalline silicon material, or single crystal silicon material, or the like, which are not limited herein. The first gate layer 122 is patterned to form a first gate of the thin film transistor and a first electrode plate of a capacitor. In addition, the second gate layer 123 is patterned to form a second gate of the thin film transistor and a second electrode plate of the capacitor. The first gate and the second gate simultaneously correspond to the channel region of the active layer 121. The first source-and-drain layer 124 is patterned to form a source and a drain of the thin film transistor. The source and the drain are connected to the doped regions on both sides of the channel region through through-holes passing through the first gate insulation layer 131, the second gate insulation layer 132, the first interlayer insulation layer 133, and the second interlayer insulation layer 134, respectively. The second source-and-drain layer 126 is patterned to form a transition source and a transition drain of the thin film transistor. The transition source is connected to the source through the through-hole passing through the first planarization layer 141. The transition drain is connected to the drain through the through-hole passing through the first planarization layer 141. Materials of the first source-and-drain layer 124 and the second source-and-drain layer 126 are inorganic metal materials, including but not limited to metallic molybdenum, aluminum, copper, titanium, chromium, silver, or mixtures thereof. Components such as thin film transistors and capacitors, as well as signal lines, constitute a drive circuit for the display panel, together. The first gate insulation layer 131 is disposed between the semiconductor active layer 121 and the first gate layer 122. The second gate insulation layer 132 is disposed between the first gate layer 122 and the second gate layer 123. The first interlayer insulation layer 133 and the second interlayer insulation layer 134 are disposed between the second gate layer 123 and the source-and-drain layer 124. The first interlayer insulation layer 133 is an inorganic interlayer insulation layer. The second interlayer insulation layer 134 is an organic interlayer insulation layer. The first gate insulation layer 131, the second gate insulation layer 132, and the first interlayer insulation layer 133 are used to isolate two conductive layers adjacent to each of the first gate insulation layer 131, the second gate insulation layer 132, and the first interlayer insulation layer 133. The insulation layer 134 is used to planarize the first interlayer insulation layer 133 to provide a planar substrate for preparing the first source-and-drain layer 124, including but not limited to organic materials, such as acrylic, polyimide (PI), or benzocyclobutene (BCB). The first planarization layer 141 is provided on the first source-and-drain layer 124. The second planarization layer 143 is provided on the second source-and-drain layer 126. The first planarization layer 141 and the second planarization layer 143 are used to planarize lower-film layers to provide a planar substrate for preparing an upper-film layer. The first planarization layer 141 and the second planarization layer 143 are generally organic layers, including but not limited to organic materials, such as acrylic, polyimide (PI), or benzocyclobutene (BCB). The first electrode layer 151 is disposed on the second planarization layer 143 and is patterned to form first electrodes that are separately disposed and independent of each other. The first electrodes are connected to the transition source or the transition drain of the thin film transistor underneath the first electrodes through the through-hole passing through the second planarization layer 143, thereby connecting with the driving circuit of the display panel. The material of the first electrode layer 151 is an inorganic metal material, including but not limited to indium tin oxide, indium zinc oxide, aluminum tin oxide, aluminum zinc oxide, indium gallium zinc oxide, magnesium, or silver. The pixel defining layer 160 is disposed on the first electrode layer 151 and is patterned to form pixel openings. The pixel openings correspond to the first electrodes in a one-to-one manner and expose the first electrodes.

In an embodiment, as shown in FIGS. 1 to 5, the undercut structure includes one sub-undercut structure consisting of an inorganic layer and an organic layer under the inorganic layer and in contact with the inorganic layer in a stacked manner. The organic layer may be a single-layered organic film layer, a double-layered organic film layer, or a three-layered organic film layer.

Figure 2:
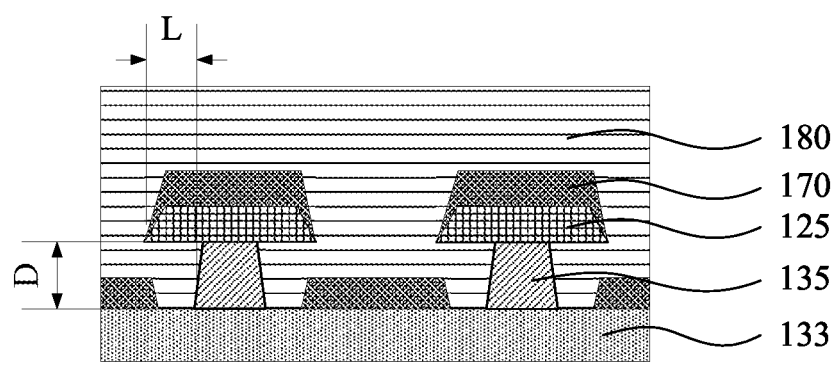
FIG. 2 is a schematic diagram of a second structure of the display panel provided by an embodiment of the present disclosure.
Figure 3:
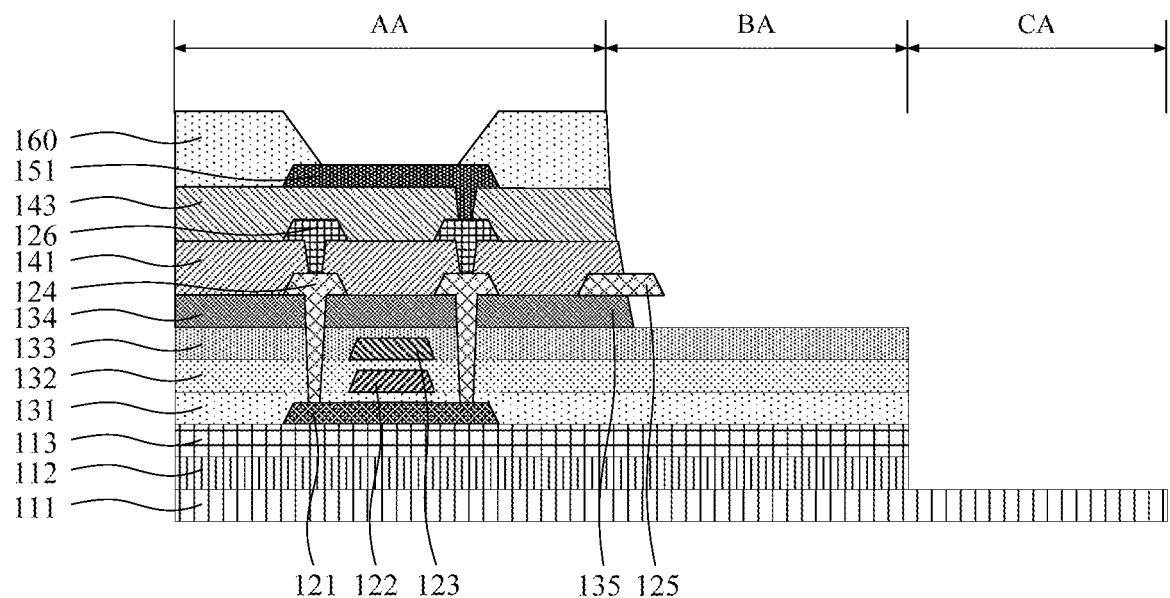
FIG. 3 is a schematic diagram of a third structure of the display panel provided by an embodiment of the present disclosure.

Please refer to FIGS. 1 and 2, a first implementation, as shown in FIG. 2, shows a second schematic structural diagram of the display panel provided in an embodiment of the present disclosure and specifically shows an enlarged effect diagram of a dotted area in FIG. 1. In the transition region BA, the display panel further includes a second interlayer insulation layer 135 and a first source-and-drain layer 125. The first source-and-drain layer 125 is located on the second interlayer insulation layer 135, wherein the first source-and-drain layer 125 is in contact with the second interlayer insulation layer 135 and completely covers the second interlayer insulation layer 135. The second interlayer insulation layer 135 and the first source-and-drain layer 125 form a sub-undercut structure, in which a lower-layer structure is a single organic layer, and an upper-layer structure is a metal-inorganic layer. The sub-undercut structure is also known as an undercut structure. The second interlayer insulation layer 135 within the transition region BA and the second interlayer insulation layer 134 within the display region AA are prepared by the same manufacturing process. The first source-and-drain layer 125 within the transition region BA and the first source-and-drain layer 124 within the display region AA are prepared by the same manufacturing process. An orthographic projection area of the second interlayer insulation layer 135 on the substrate 111 is within an orthographic projection area of the first source-and-drain layer 125 on the substrate 111. A minimum distance L between an edge of the orthographic projection area of the second interlayer insulation layer 135 on the substrate 111 and an edge of the orthographic projection area of the first source-and-drain layer 125 on the substrate 111 is greater than a thickness D of the second interlayer insulation layer 135.

As shown in FIG. 2, the display panel further includes an organic light-emitting layer 170 and an encapsulation layer 180. The organic light-emitting layer 170 is formed on the pixel definition layer 160 and extends into the transition region BA. Within the transition region BA, the organic light-emitting layer 170 covers the first source-and-drain layer 125 and a part of the first interlayer insulation layer 133. The encapsulation layer 180 is formed on the organic light-emitting layer 170, covers the organic light-emitting layer 170, and provides encapsulation and protection to the display panel. The encapsulation layer 180 may be a single-layered inorganic encapsulation layer or a multi-laminated encapsulation structure composed of an inorganic layer and an organic layer. The multi-laminated encapsulation structure generally includes a first inorganic encapsulation layer, a second inorganic encapsulation layer, and an organic encapsulation layer between the first inorganic encapsulation layer and the second inorganic encapsulation layer, wherein the first inorganic encapsulation layer is in contact with the organic light-emitting layer 170. Because the thickness of the organic light-emitting layer 170 is small to cause that the first source-and-drain layer 125 and the second interlayer insulation layer 135 together constitute an undercut structure, the organic light-emitting layer 170 is disconnected at the undercut structure, that is, the organic light-emitting layer 170 located on the first source-and-drain layer 125 and the organic light-emitting layer 170 located on the first interlayer insulation layer 133 are not continuous. Furthermore, because the minimum distance L between the edge of the orthographic projection area of the second interlayer insulation layer 135 on the substrate 111 and the edge of the orthographic projection area of the first source-and-drain layer 125 on the substrate 111 is greater than the thickness D of the second interlayer insulation layer 135. Namely, an indented distance of the second interlayer insulation layer 135 with respect to the first source-and-drain layer 125 is greater than the thickness D of the second interlayer insulation layer 135, which further ensures that there is a disconnection of the organic light-emitting layer 170 at the undercut structure consisting of the drain layer 125 and the second interlayer insulation layer 135. It ensures that the organic light-emitting layer 170 on the first interlayer insulation layer 133 does not contact the second interlayer insulation layer 135. Namely, there is a gap between the organic light-emitting layer 170 on the first interlayer insulation layer 133 and the second interlayer insulation layer 135. The organic light-emitting layer 170 on the first interlayer insulation layer 133 is disconnected from the organic light-emitting layer 170 on the first source-and-drain layer 125. The encapsulation layer 180 is formed on the organic light-emitting layer 170 to cover the organic light-emitting layer 170. The encapsulation layer 180 fills the gap between the organic light-emitting layer 170 and the second interlayer insulation layer 135. The encapsulation layer 180 fills a disconnection between the organic light-emitting layer 170 on the first source-and-drain layer 125 and the organic light-emitting layer 170 on the interlayer insulation layer 133. The organic light-emitting layer 170 is completely clad by the first source-and-drain layer 125, the first interlayer insulation layer 133, and the single-layered inorganic encapsulation layer or the first inorganic encapsulation layer. There is no entrance of water and oxygen intrusion in a periphery of the organic light-emitting layer 170, thereby blocking a path of external water and oxygen entering the display region AA through one side of the organic light-emitting layer 170, reducing the corrosion of the display panel by external water and oxygen, to improve the stability of the display device and improve product performance.

In one implementation is provided, as shown in FIG. 1, the undercut structures formed by the first source-and-drain layer 125 and the second interlayer insulation layer 135 are not in contact with the source-and-drain layer 124 and/or the second layer both within the display region AA. The number of the undercut structures may be one or two or more. The two or more undercut structures are disposed within the transition region BA and spaced apart from each other in a direction away from the display region AA. As shown in FIG. 3A, another implementation, shows a schematic diagram of a third structure of the display panel provided by an embodiment of the present disclosure. The first source-and-drain layer 125 is connected to the source-and-drain layer 124. The second interlayer insulation layer 135 is connected to the second interlayer insulation layer 134. The undercut structures formed by the first source-and-drain layer 125 and the second interlayer insulation layer 135 are located within the transition region BA and connected to adjacent film layers within the display region AA. In this implementation, the number of the undercut structures can also be two or more, wherein one of the undercut structures is in contact with a structure of film layers within the display region AA, and the other undercut structures are disposed within the transition region BA and spaced apart from each other in a direction away from the display region AA.

Correspondingly, within the transition region BA, the display panel may include a laminated structure composed of the second source-and-drain layer and the organic interlayer insulation layer, or a laminated structure composed of the second source-and-drain layer and the first planarization layer, or a laminated structure composed of the electrode layer and the organic interlayer insulation layer, or a laminated structure composed of the first electrode layer and the first planarization layer, or a laminated structure composed of the first electrode layer and the second planarization layer, to constitute an undercut structure similar to that shown in FIG. 1, having the same technical effect as the first implementation.

Figure 4:
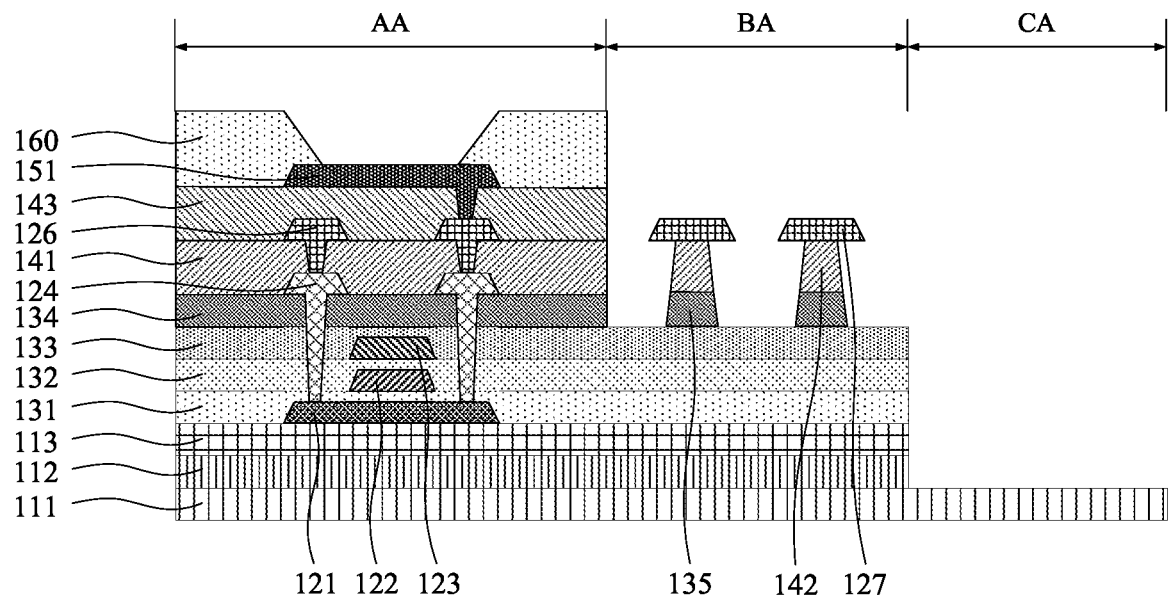
FIG. 4 is a schematic diagram of a fourth structure of the display panel provided by an embodiment of the present disclosure.

A second implementation is provided, as shown in FIG. 4, which shows a schematic diagram of a fourth structure of the display panel provided by an embodiment of the present disclosure. Within the transition region BA, the display panel further includes a second interlayer insulation layer 135, a first planarization layer 142, and a second source-and-drain layer 127, wherein the first planarization layer 142 is located on the second interlayer insulation layer 135. An orthographic projection area of the first planarization layer 142 on the substrate 111 coincides with an orthographic projection area of the second interlayer insulation layer 135 on the substrate 111. The second source-and-drain layer 127 is located on the first planarization layer 142, is in contact with the first planarization layer 142, and completely covers the first planarization layer 142. The second interlayer insulation layer 135 and the first planarization layer 142 together form an organic layer of a sub-undercut structure. The second interlayer insulation layer 135, the first planarization layer 142, and the second source-and-drain layer 127 constitute an undercut structure, in which a lower-layer structure is a double-layered organic layer, and an upper-layer structure is a metal inorganic layer. The second interlayer insulation layer 135 within the transition region BA and the second interlayer insulation layer 134 within the display region AA are prepared by the same manufacturing process. The first planarization layer 142 within the transition region BA and the first planarization layer 141 within the display region AA are prepared by the same manufacturing process. The second source-and-drain layer 127 within the transition region BA and the second source-and-drain layer 126 within the display region AA are prepared by the same manufacturing process. The orthographic projection area of the first planarization layer 142 on the substrate 111 is located within an orthographic projection area of the second source-and-drain layer 127 on the substrate 111. A minimum distance between an edge of the orthographic projection area of the first planarization layer 142 on the substrate 111 and an edge of the orthographic projection area of the second source-and-drain layer 127 on the substrate 111 is greater than a sum of thicknesses of the first planarization layer 142 and the second interlayer insulation layer 135. The undercut structure formed by the second interlayer insulation layer 135, the first planarization layer 142, and the second source-and-drain layer 127 is similar to the undercut structure formed by the first source-and-drain layer 125 and the second interlayer insulation layer 135 in the embodiment shown in FIG. 1. The specific implementation and working principle are similar to the undercut structure formed by the first source-and-drain layer 125 and the second interlayer insulation layer 135 in the embodiment shown in FIG. 1. For details, please refer to the above-mentioned embodiment, which will not be repeated here.

In this implementation, the undercut structure consisting of the second interlayer insulation layer 135, the first planarization layer 142, and the second source-and-drain layer 127 is provided within the transition region, so that in the subsequent manufacturing process of the display panel, the organic light-emitting layer is disconnected at the undercut structure. An encapsulation layer is provided to encapsulate and protect the organic light-emitting layer at a disconnection position, to block a path of external water and oxygen entering the display region through one side of the organic light-emitting layer, thereby reducing the risk of external water and oxygen eroding the display panel, to improve the stability of the display device and improve the product performance.

Correspondingly, within the transition region BA, the display panel may include a laminated structure composed of the first electrode layer, the organic interlayer insulation layer, and the first planarization layer, or a laminated structure composed of the first electrode layer, the organic interlayer insulation layer, and the second planarization layer, or a laminated structure composed of the first electrode layer, the first planarization layer, and the second planarization layer to constitute an undercut structure similar to that of FIG. 4, having the same technical effect as the second implementation.

Figure 5:
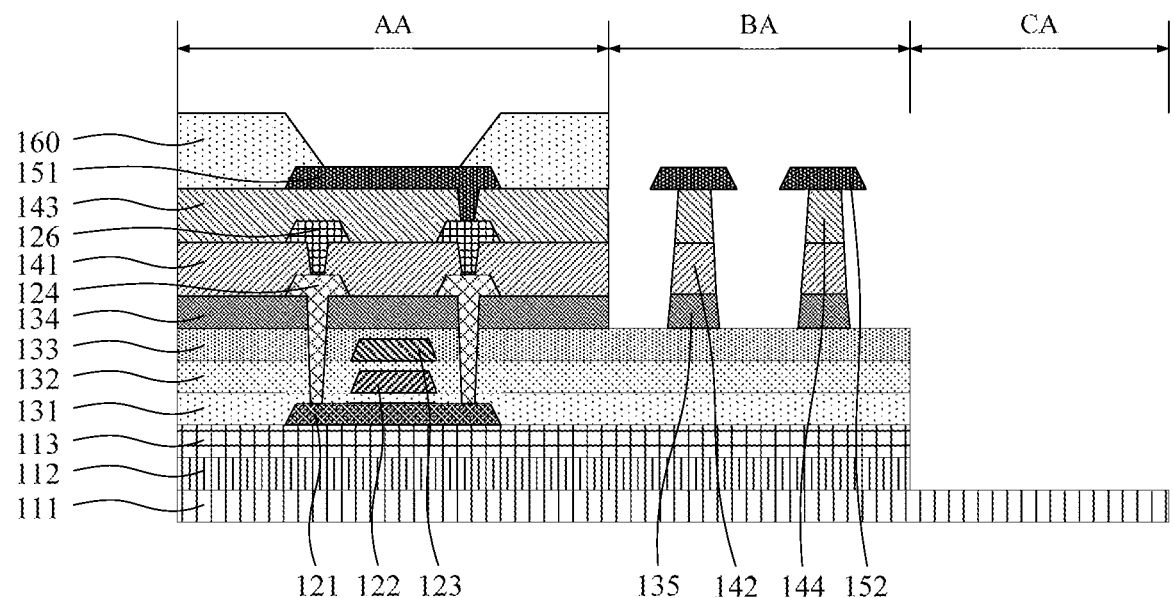
FIG. 5 is a schematic diagram of a fifth structure of the display panel provided by an embodiment of the present disclosure.

A third implementation is provided, as shown in FIG. 5, which shows a fifth schematic structural diagram of the display panel provided by the embodiment of the present disclosure. Within the transition region BA, the display panel includes a second interlayer insulation layer 135, a first planarization layer 142, a second planarization layer 144, and a first electrode layer 152. The first planarization layer 142 is disposed on the second interlayer insulation layer 135. The second planarization layer 144 is disposed on the first planarization layer 142. An orthographic projection area of the second planarization layer 144 on the substrate 111, an orthographic projection area of the first planarization layer 142 on the substrate 111, and an orthographic projection area of the second interlayer insulation layer 135 on the substrate 111 coincide with each other. The first electrode layer 152 is located on the second planarization layer 144, is in contact with the second planarization layer 144, and completely covers the second planarization layer 144. The second interlayer insulation layer 135, the first planarization layer 142, and the second planarization layer 144 together form an organic layer of a sub-undercut structure. The second interlayer insulation layer 135, the first planarization layer 142, the second planarization layer 144, and the first electrode layer 152 constitute an undercut structure, in which a lower-layer structure is a three-layered organic layer, and an upper-layer structure is a metal inorganic layer. The second interlayer insulation layer 135 within the transition region BA and the second interlayer insulation layer 134 within the display region AA are prepared by the same manufacturing process. The first planarization layer 142 within the transition region BA and the first planarization layer 141 within the display region AA are prepared by the same manufacturing process. The second planarization layer 144 within the transition region BA and the second planarization layer 143 in the display region AA are prepared by the same manufacturing process. The first electrode layer 152 within the transition region BA and the first electrode layer 151 within the display region AA are prepared by the same manufacturing process. An orthographic projection area of the second planarization layer 144 on the substrate 111 is located within an orthographic projection area of the first electrode layer 152 on the substrate 111. A minimum distance between an edge of the orthographic projection area of the second planarization layer 144 on the substrate 111 and an edge of the orthographic projection area of the first electrode layer 152 on the substrate 111 is greater than a sum of thicknesses of the second planarization layer 144, the first planarization layer 142, and the second interlayer insulation layer 135. The undercut structure formed by the second interlayer insulation layer 135, the first planarization layer 142, the second planarization layer 144, and the first electrode layer 152 is similar to the undercut structure formed by the first source-and-drain layer 125 and the second interlayer insulation layer 135 in the embodiment shown in FIG. 1. The specific implementation and working principle are similar to the undercut structure formed by the first source-and-drain layer 125 and the second interlayer insulation layer 135 in the embodiment shown in FIG. 1. For details, please refer to the above-mentioned embodiment, which will not be repeated here.

In this implementation, the undercut structure consisting of the second interlayer insulation layer 135, the first planarization layer 142, the second planarization layer 144, and the first electrode layer 152 is provided within the transition region, so that in the subsequent manufacturing process of the display panel, the organic light-emitting layer is disconnected at the undercut structure. An encapsulation layer is provided to encapsulate and protect the organic light-emitting layer at a disconnection position, to block a path of external water and oxygen entering the display region through one side of the organic light-emitting layer, thereby reducing the risk of the external water and oxygen corroding the display panel, to improve the stability of the display device and improve the product performance.

Figure 6:
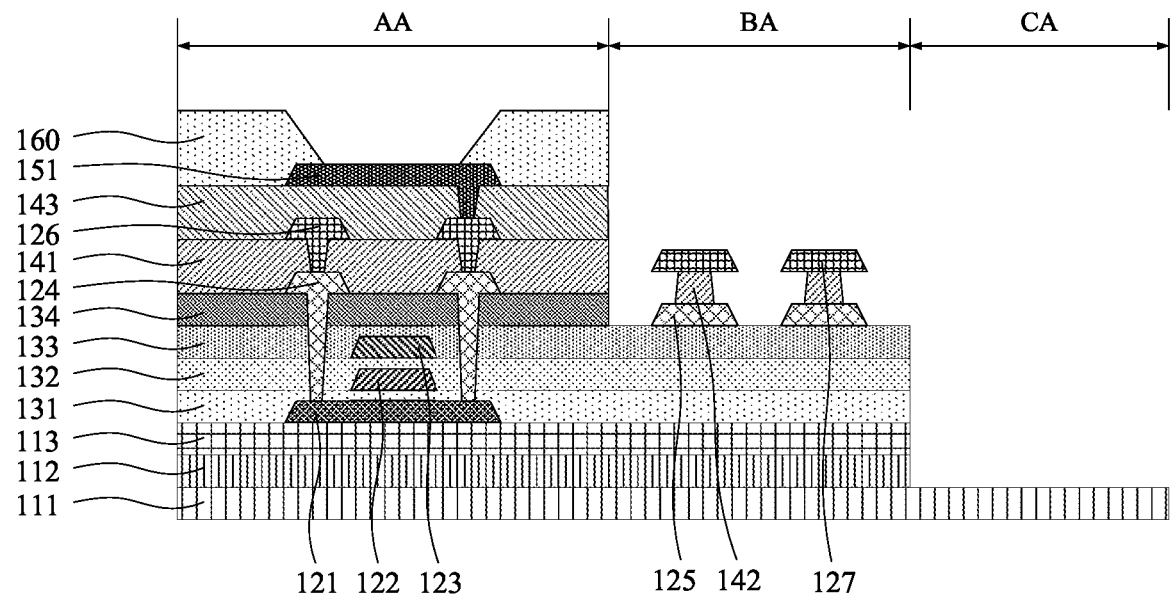
FIG. 6 is a schematic diagram of a sixth structure of the display panel provided by an embodiment of the present disclosure.

Another embodiment is provided, as shown in FIG. 6, which shows a schematic diagram of a sixth structure of the display panel provided by an embodiment of the present disclosure. Within the transition region BA, the display panel further includes a first source-and-drain layer 125, a first planarization layer 142, and a second source-and-drain layer 127. The first planarization layer 142 is located on the first source-and-drain layer 125. The second source-and-drain layer 127 is located on the first planarization layer 142, is in contact with the first planarization layer 142, and completely covers the first planarization layer 142. The first planarization layer 142 and the second source-and-drain layer 127 constitute a sub-undercut structure, in which a lower-layer structure is an organic layer, and an upper-layer structure is a metal-inorganic layer. The first source-and-drain layer 125, the planarization layer 142, and the second source-and-drain layer 127 constitute an undercut structure. The first source-and-drain layer 125 within the transition region BA and the first source-and-drain layer 124 within the display region AA are prepared by the same manufacturing process. An orthographic projection area of the first planarization layer 142 on the substrate 111 is located in an orthographic projection area of the first source-and-drain layer 125 on the substrate 111. An orthographic projection area of the second source-and-drain layer 127 on the substrate 111 is in an orthographic projection area of the first source-and-drain layer 125 on the substrate 111 or coincides with the orthographic projection area of the first source-and-drain layer 125 on the substrate 111. The sub-undercut structure formed by the first planarization layer 142 and the second source-and-drain layer 127 is similar to the sub-undercut structure in the first embodiment. The specific implementation and working principle are also the same as the sub-undercut in the first embodiment. For details, please refer to the above-mentioned embodiments, which will not be repeated here. In this embodiment, the first source-and-drain layer 125 is provided under the first planarization layer 142, and a step structure is formed between the first interlayer insulation layer 133 and the first planarization layer 142, which extends a path between the first interlayer insulation layer 133 and the first planarization layer 142, further ensures that the organic light-emitting layer is disconnected at the undercut structure formed by the first planarization layer 142 and the second source-and-drain layer 127 in the subsequent manufacturing process, and further ensures that the organic light-emitting layer 170 located on the first interlayer insulation layer 133 is not in contact with the first planarization layer 142.

In this embodiment, an undercut structure consisting of a first source-and-drain layer 125, a first planarization layer 142, and a second source-and-drain layer 127 is provided within the transition region. The first source-and-drain layer 125 serves as a step structure of the sub-undercut structure. In the subsequent manufacturing process of the display panel, the disconnection effect of the organic light-emitting layer at the undercut structure is further improved. An encapsulation layer encapsulates and protects the organic light-emitting layer at a disconnection position, to block a path of water and oxygen from passing through one side of the organic light-emitting layer, thereby reducing the risk of external water and oxygen eroding the display panel, to improve the stability of the display device and improve product performance.

Correspondingly, within the transition region BA, the display panel may include a laminated structure composed of a first source-and-drain layer, a first planarization layer, and a first electrode layer, or a laminated structure composed of a first source-and-drain layer, a first planarization layer, and a second planarization layer, and the first electrode layer, or a laminated structure composed of the second source-and-drain layer, the second planarization layer, and the first electrode layer, to constitute an undercut structure similar to that shown in FIG. 6, having the same technical effect as the second embodiment.

Figure 7:
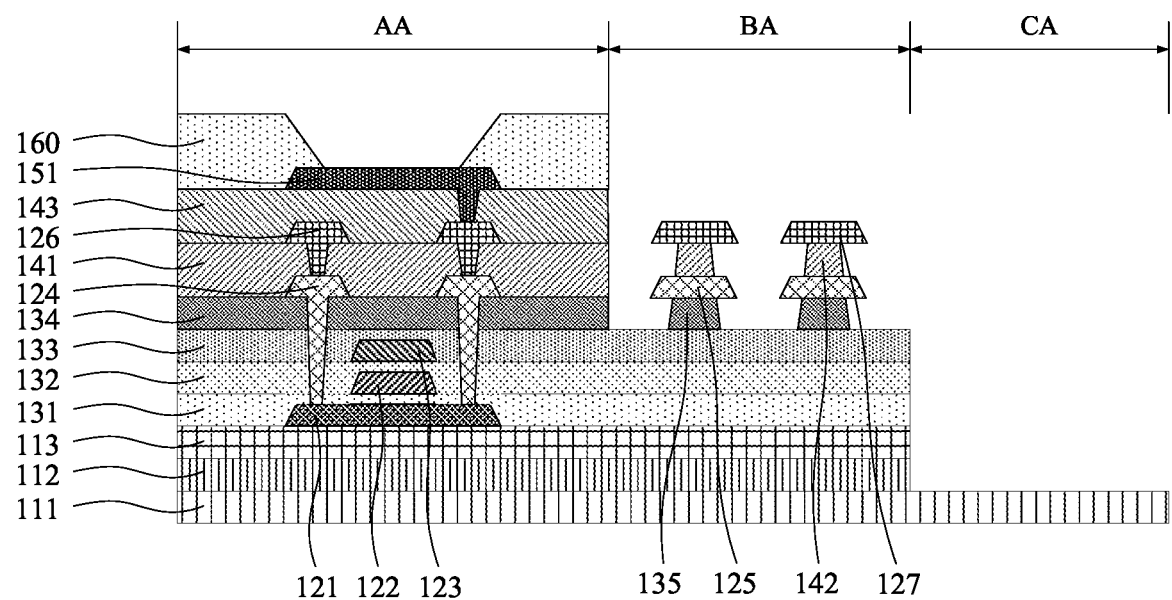
FIG. 7 is a schematic diagram of a seventh structure of the display panel provided by an embodiment of the present disclosure.

A third embodiment is provided, as shown in FIG. 7, which shows a seventh structural diagram of the display panel provided by the embodiment of the present disclosure. Within the transition region BA, the display panel further includes a second interlayer insulation layer 135, a first source-and-drain layer 125, a first planarization layer 142, and a second source-and-drain layer 127. The second interlayer insulation layer 135 and the first source-and-drain layer 125 constitute a first sub-undercut structure. The first planarization layer 142 and the second source-and-drain layer 127 constitute a second sub-undercut structure. The first sub-undercut structure and the second sub-undercut structure are stacked. The first sub-undercut structure and the second sub-undercut structure are similar to the sub-undercut structure in the first embodiment. The specific implementation and working principle are also the same as the sub-undercut structure in the first embodiment. For details, please refer to the above-mentioned embodiment, which will not be repeated here. An orthographic projection area of the first planarization layer 142 on the substrate 111 is located within an orthographic projection area of the first source-and-drain layer 125 on the substrate 111. An orthographic projection area of the second source-and-drain layer 127 on the substrate 111 is located within the orthographic projection area of the first source-and-drain layer 125 on the substrate 111 or coincides with the orthographic projection area of the first source-and-drain layer 125 on the substrate 111.

In this embodiment, by providing an undercut structure consisting of a double-layer sub-undercut structure within the transition region, the disconnection effect of the organic light-emitting layer at the undercut structure in the subsequent manufacturing process of the display panel is further improved. An encapsulation layer encapsulates and protects the organic light-emitting layer at a disconnection position, to block a path of external water and oxygen entering the display region through one side of the organic light-emitting layer, thereby reducing the risk of external water and oxygen eroding the display panel, to improve the stability of the display device and improve the product performance.

Correspondingly, within the transition region BA, the display panel may include a laminated structure composed of a second interlayer insulation layer, a first source-and-drain layer, a first planarization layer, and a first electrode layer, or a laminated structure composed of the second interlayer insulation layer, the source-and-drain layer, the first planarization layer, a second planarization layer, and the first electrode layer, or a laminated structure composed of the second interlayer insulation layer, a second source-and-drain layer, the second planarization layer, and the first electrode layer, or a laminated structure composed of the first planarization layer, the second source-and-drain layer, the second planarization layer, and the first electrode layer, to form a double-layer sub-undercut structure similar to that shown in FIG. 7, having the same technical effect as the third embodiment.

The embodiments of the present disclosure also provide a display device. The display device includes any one of the display panels provided in the embodiments of the present disclosure and has technical features and technical effects of any one of the display panels provided in the embodiments of the present disclosure. Specific implementation manners and working principles, please refer to the above specific embodiment, which will not be repeated here.

Figure 8:
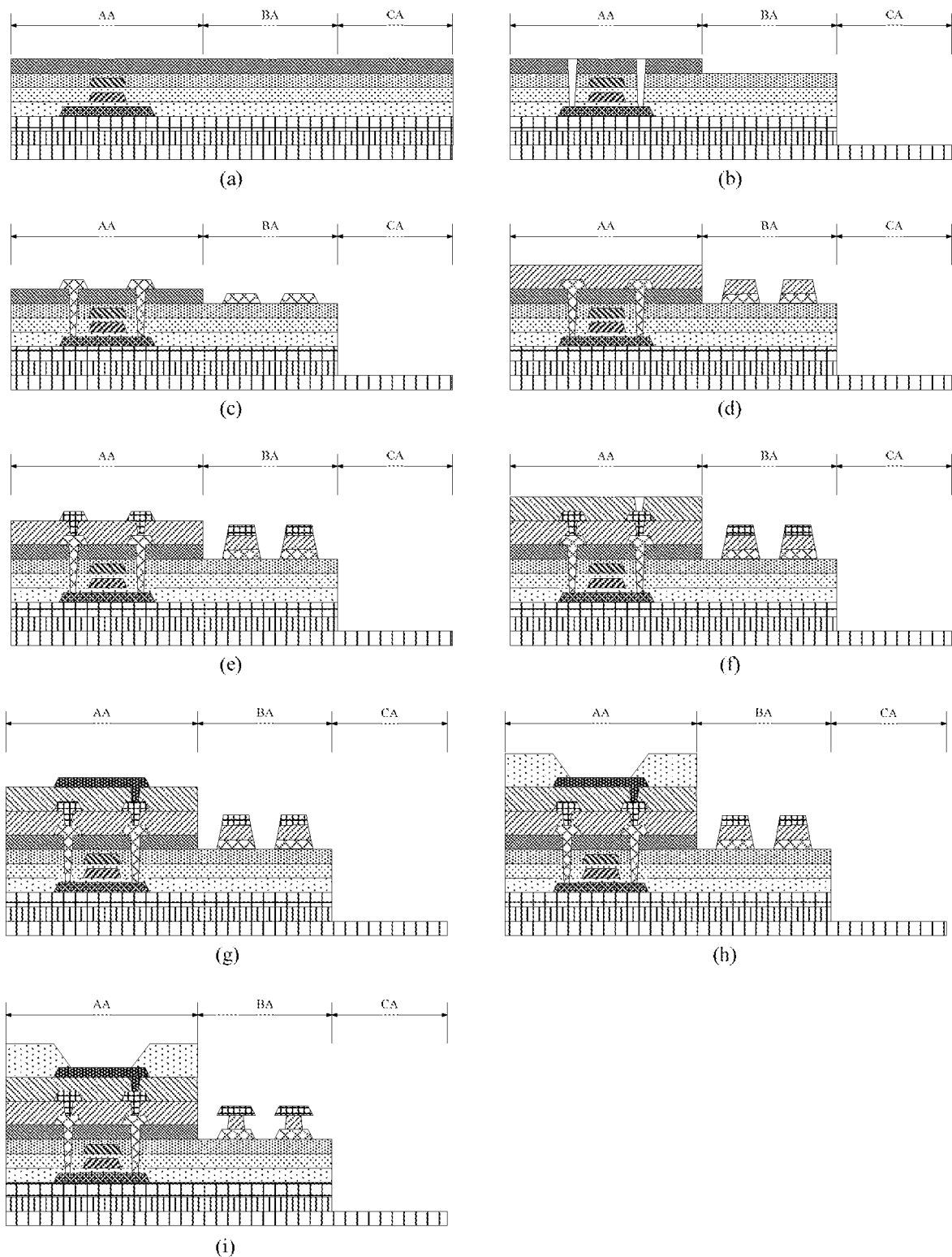
FIG. 8 is a schematic structural diagram of a manufacturing method of a display panel provided by an embodiment of the present disclosure.

An embodiment of the present disclosure also provides a manufacturing method of a display panel, the manufacturing method includes:

Step S1: preparing a substrate, a light-shielding layer, a buffer layer, a semiconductor active layer, a first gate insulation layer, a first gate layer, a second gate insulation layer, a second gate layer, a first interlayer insulation layer, and a second interlayer insulation layer, as shown in (a) of FIG. 8.

Step S2: defining a hole in an optical-device region CA, to remove other film structures in the optical-device region CA, leave only the substrate, remove the second interlayer insulation layer within a transition region BA, and prepare source-and-drain through-holes in a display region AA, as shown in (b) of FIG. 8.

Step S3: preparing a first source-and-drain layer on the second interlayer insulation layer and performing a patterning process, as shown in (c) of FIG. 8.

Step S4: preparing a first planarization layer on the first source-and-drain layer and performing a patterning process, as shown in (d) of FIG. 8.

Step S5: preparing a second source-and-drain layer on the first planarization layer and performing a patterning process, as shown in (e) of FIG. 8.

Step S6: preparing a second planarization layer on the second source-and-drain layer and performing a patterning process to form first electrode through-holes within the display region AA and remove the second planarization layer within the transition region BA and the optical-device region CA, as shown in (f) of FIG. 8.

Step S7: preparing a first electrode layer on the second planarization layer and performing a patterning process to form first electrodes within the display region AA, and remove the first electrode layer within the transition region BA and the optical-device region CA, as shown in (g) of FIG. 8.

Step S8: preparing a pixel definition layer on the first electrode layer and performing a patterning process to form a plurality of pixel openings within the display region AA and remove the pixel definition layer within the transition region BA and the optical-device region CA, as shown in (h) of FIG. 8.

In step S9, performing a dry-etching process within the transition region BA to form an undercut structure in which a lower layer is an organic layer and an upper layer is an inorganic layer, as shown in (i) of FIG. 8.

Specifically, a photoresist is used to protect a structure of film layers within the display region AA, and an etching gas containing oxygen is used to dry-etch the film layers within the transition region BA. Since oxygen has essentially no etching effect on the inorganic layer but has a strong etching effect on the organic layer, in this step, oxygen will etch one side of the first planarization layer, wherein an etching rate can be adjusted by adjusting process parameters and the maximum rate can reach 300 nanometers/min. The dry-etching technique used in this step needs simple etching gas and has a large range for adjusting the etching rate. An etching selection ratio of the organic layer and the inorganic layer (i.e., a ratio of the etching rate of the organic layer and the inorganic layer) can be implemented as a tremendous value, which is beneficial to increase production capacity and reduce costs. In another aspect, the etching effect on the organic layer by oxygen is more uniform, which can ensure a precise line width and good morphology of the undercut structure. In one embodiment, after an etching process is completed, a projection area of the first planarization layer on the substrate is within a projection area of the second source-and-drain layer on the substrate, wherein a distance between an edge of the projection area of the first planarization layer on the substrate and an edge of the projection area of the second source-and-drain layer on the substrate is greater than a thickness of the first planarization layer.

As shown in (i) of FIG. 8, the undercut structure, causes the organic light-emitting layer to be disconnected at the undercut structure in the subsequent evaporation process. By providing the distance between an edge of the projection area of the first planarization layer on the substrate and an edge of the projection area of the second source-and-drain layer on the substrate greater than the thickness of the first planarization layer, the organic light-emitting layer has no contact with the first planarization layer. When the display panel is encapsulated by the subsequent encapsulation layer, an inorganic encapsulation layer can provide encapsulation and protection of the organic light-emitting layer at a disconnection position, to block water and oxygen from entering the display region through one side of the organic light-emitting layer, thereby reducing the risk of external water and oxygen eroding the display panel, to improve the stability of the display device and improve product performance.

In summary, the embodiments of the present disclosure provide a display panel, a manufacturing method thereof, and a display device. The display panel is provided by providing the undercut structure within the transition region of the display panel, such that in the subsequent manufacturing process of the display panel, an organic light-emitting layer is disconnected at the undercut structure. The encapsulation layer encapsulates and protects the organic light-emitting layer at the disconnection position, to block the path of external water and oxygen entering the display region through one side of the organic light-emitting layer, thereby reducing the risk of external water and oxygen corroding the display panel, to improve the stability of the display device and improve the product performance.

The display panel and the display device provided by the embodiments of the present disclosure are described in detail above. Specific examples are used herein to explain the principles and implementations of the present disclosure. The descriptions of the above embodiments are only used to help understand the methods of the present disclosure and its core ideas. At the same time, for those skilled in the art, according to the ideas of the present disclosure, there will be changes in the specific implementation and scope of application. In summary, the content of the present specification should not be understood as a limit to the present disclosure.

What is claimed is:

1. A display panel, comprising a display region, an optical-device region, and a transition region between the display region and the optical-device region,
   wherein the display panel comprises:
   a substrate; and
   a thin-film-transistor layer disposed on one side of the substrate, wherein the thin-film-transistor layer comprises at least one undercut structure within the transition region, wherein the undercut structure comprises at least one inorganic layer and at least one organic layer; wherein one inorganic layer is at least disposed on one side of the organic layer away from the substrate; and wherein an orthographic projection area of the organic layer on the substrate is located within an orthographic projection area, of the inorganic layer away from one side of the substrate and close to the organic layer, on the substrate;
   wherein the undercut structure comprises at least one sub-undercut structure that comprises one inorganic layer and at least one organic layer, wherein in each sub-undercut structure, the organic layer is stacked and disposed on one side of the inorganic layer close to the substrate; and
   wherein in the sub-undercut structure, a minimum distance is defined between an edge of the orthographic projection area, of one side, of the organic layer away from the inorganic layer, away from the display region, on the substrate, and an edge of the orthographic projection area, of one side of the inorganic layer away from the display region, on the substrate, and wherein the minimum distance is greater than a total thickness of the at least one organic layer.

2. The display panel as claimed in claim 1, wherein the display panel further comprises a first array layer within the transition region, the first array layer is disposed between the substrate and the undercut structure, and the first array layer comprises at least one inorganic insulation layer; and
   wherein in the sub-undercut structure close to the first array layer, the organic layer close to the substrate is directly in contact with the inorganic insulation layer in the first array layer.

3. The display panel as claimed in claim 2, wherein the undercut structure comprises one sub-undercut structure that comprises one organic layer, two organic layers, or three organic layers.

4. The display panel as claimed in claim 3, wherein the thin-film-transistor layer comprises an organic interlayer insulation layer, a first source-and-drain layer, a first planarization layer, a second source-and-drain layer, a second planarization layer, and a first electrode layer, and the sub-undercut structure is one of following laminated structures:
   a laminated structure composed of the first source-and-drain layer and the organic interlayer insulation layer;
   a laminated structure composed of the second source-and-drain layer and the organic interlayer insulation layer;
   a laminated structure composed of the second source-and-drain layer and the first planarization layer;
   a laminated structure composed of the second source-and-drain layer, the first planarization layer, and the organic interlayer insulation layer;
   a laminated structure composed of the first electrode layer and the organic interlayer insulation layer;
   a laminated structure composed of the first electrode layer and the first planarization layer;
   a laminated structure composed of the first electrode layer and the second planarization layer;
   a laminated structure composed of the first electrode layer, the organic interlayer insulation layer, and the first planarization layer;

a laminated structure composed of the first electrode layer, the organic interlayer insulation layer, and the second planarization layer;

a laminated structure composed of the first electrode layer, the first planarization layer, and the second planarization layer; and a laminated structure composed of the first electrode layer, the organic interlayer insulation layer, the first planarization layer, and the second planarization layer.

5. The display panel as claimed in claim 2, wherein the undercut structure comprises one sub-undercut structure and a second inorganic layer, and the second inorganic layer is disposed on one side of the sub-undercut structure close to the substrate, and the orthographic projection area of each organic layer in the sub-undercut structure on the substrate is located within an orthographic projection area of the second inorganic layer on the substrate.

6. The display panel as claimed in claim 5, wherein the thin-film-transistor layer comprises an organic interlayer insulation layer, a first source-and-drain layer, a first planarization layer, a second source-and-drain layer, a second planarization layer, and a first electrode layer, and the undercut structure is one of following laminated structures:

a laminated structure composed of the first source-and-drain layer, the first planarization layer, and the first electrode layer;

a laminated structure composed of the first source-and-drain layer, the first planarization layer, and the second source-and-drain layer;

a laminated structure composed of the first source-and-drain layer, the first planarization layer, the second planarization layer, and the first electrode layer; and a laminated structure composed of the second source-and-drain layer, the second planarization layer, and the first electrode layer.

7. The display panel as claimed in claim 2, wherein the undercut structure comprises a first sub-undercut structure and a second sub-undercut structure that are stacked, and the first sub-undercut structure is disposed on one side of the second undercut structure away from the substrate.

8. The display panel as claimed in claim 7, wherein the orthographic projection area of each organic layer in the first sub-undercut structure on the substrate is located within an orthographic projection area of the inorganic layer in the second sub-undercut structure on the substrate.

9. The display panel as claimed in claim 8, wherein the thin-film-transistor layer comprises an organic interlayer insulation layer, a first source-and-drain layer, a first planarization layer, a second source-and-drain layer, a second planarization layer, and a first electrode layer, and the undercut structure is one of following laminated structures:

a laminated structure composed of the organic interlayer insulation layer, the first source-and-drain layer, the first planarization layer, and the second source-and-drain layer;

a laminated structure composed of the organic interlayer insulation layer, the first source-and-drain layer, the first planarization layer, and the first electrode layer;

a laminated structure composed of the organic interlayer insulation layer, the first source-and-drain layer, the first planarization layer, the second planarization layer, and the first electrode layer;

a laminated structure composed of the organic interlayer insulation layer, the second source-and-drain layer, the second planarization layer, and the first electrode layer;

a laminated structure composed of the organic interlayer insulation layer, the first planarization layer, the second source-and-drain layer, the second planarization layer, and the first electrode layer; and a laminated structure of the first planarization layer, the second source-and-drain layer, the second planarization layer, and the first electrode layer.

10. The display panel as claimed in claim 2, wherein the first array layer extends into the display region, and wherein within the display region, the display panel further comprises a second array layer that is disposed on one side of the first array layer away from the substrate, and the undercut structure is spaced apart from the second array layer.

11. The display panel as claimed in claim 10, wherein the display panel comprises two or more undercut structures that are disposed within the transition region and spaced apart from each other in a direction away from the display region.

12. The display panel as claimed in claim 11, wherein the second array layer comprises an inorganic metal layer and an organic insulation layer, and the organic insulation layer is disposed on one side of the inorganic metal layer close to the substrate, and wherein the organic layer and the organic insulation layer are provided in a manner of the same layer, and the inorganic layer and the inorganic metal layer are provided in a manner of the same layer.

13. The display panel as claimed in claim 2, wherein the first array layer extends into the display region, and wherein within the display region, the display panel further comprises a second array layer that is disposed on one side of the first array layer away from the substrate, and there is one undercut structure connected to the second array layer.

14. The display panel as claimed in claim 13, wherein the second array layer comprises an inorganic metal layer and an organic insulation layer, and the organic insulation layer is disposed on one side of the inorganic metal layer close to the substrate, and wherein the organic layer and the organic insulation layer are provided in a manner of the same layer, and the inorganic layer and the inorganic metal layer are provided in a manner of the same layer.

15. A display device, comprising a display panel that comprises a display region, an optical-device region, and a transition region between the display region and the optical-device region, wherein the display panel comprises:

a substrate; and a thin-film-transistor layer disposed on one side of the substrate, wherein the thin-film-transistor layer comprises at least one undercut structure within the transition region, wherein the undercut structure comprises at least one inorganic layer and at least one organic layer; wherein one inorganic layer is at least disposed on one side of the organic layer away from the substrate; and wherein an orthographic projection area of the organic layer on the substrate is located within an orthographic projection area, of the inorganic layer away from one side of the substrate and close to the organic layer, on the substrate;

wherein the undercut structure comprises at least one sub-undercut structure that comprises one inorganic layer and at least one organic layer, wherein in each sub-undercut structure, the organic layer is stacked and disposed on one side of the inorganic layer close to the substrate; and wherein in the sub-undercut structure, a minimum distance is defined between an edge of the orthographic projection area, of one side, of the organic layer away from the inorganic layer, away from the display region, on the substrate, and an edge of the orthographic projection area, of one side of the inorganic layer away from the display region, on the substrate, and wherein the minimum distance is greater than a total thickness of the at least one organic layer.

16. The display device as claimed in claim 15, wherein the display panel further comprises a first array layer within the transition region, the first array layer is disposed between the substrate and the undercut structure, and the first array layer comprises at least one inorganic insulation layer; and wherein in the sub-undercut structure close to the first array layer, the organic layer close to the substrate is directly in contact with the inorganic insulating layer in the first array layer.

17. The display device as claimed in claim 16, wherein the undercut structure comprises one sub-undercut structure that comprises one organic layer, two organic layers, or three organic layers.

18. The display device as claimed in claim 16, wherein the undercut structure comprises a first sub-undercut structure and a second sub-undercut structure that are stacked, and the first sub-undercut structure is disposed on one side of the second undercut structure away from the substrate.

19. The display device as claimed in claim 18, wherein the orthographic projection area of each organic layer in the first sub-undercut structure on the substrate is located within an orthographic projection area of the inorganic layer in the second sub-undercut structure on the substrate.

20. The display device as claimed in claim 16, wherein the first array layer extends into the display region, and wherein within the display region, the display panel further comprises a second array layer that is disposed on one side of the first array layer away from the substrate, and the undercut structure is spaced apart from the second array layer.

* * * * *